United States Patent
Dong (10) Patent No.: US 11,057,247 B2
(45) Date of Patent: *Jul. 6, 2021

(54) TRANSMITTER WITH SELF-TRIGGERED TRANSITION EQUALIZER

(71) Applicant: Rambus Inc., Sunnyvale, CA (US)

(72) Inventor: Yikui Jen Dong, Cupertino, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,549

(22) Filed: Dec. 2, 2019

(65) Prior Publication Data

US 2020/0136866 A1  Apr. 30, 2020

Related U.S. Application Data

(63) Continuation of application No. 15/761,938, filed as application No. PCT/US2016/045426 on Aug. 3, 2016, now Pat. No. 10,530,616.

(Continued)

(51) Int. Cl.
*H04L 25/03* (2006.01)
*G11C 7/10* (2006.01)
*H04L 25/02* (2006.01)

(52) U.S. Cl.
CPC ...... *H04L 25/03343* (2013.01); *G11C 7/1057* (2013.01); *G11C 7/1069* (2013.01); *H04L 25/028* (2013.01); *H04L 25/0272* (2013.01); *H04L 25/03* (2013.01); *H04L 25/03012* (2013.01); *H04L 25/03878* (2013.01); *H04L 25/03885* (2013.01); *G11C 2207/107* (2013.01)

(58) Field of Classification Search
CPC ........... H04L 25/03343; H04L 25/0272; H04L 25/028; H04L 25/03; H04L 25/03012; H04L 25/03878; H04L 25/03885; G11C 7/1057; G11C 7/1069; G11C 2207/107
See application file for complete search history.

(56) References Cited

U.S. PATENT DOCUMENTS 5,835,440 A  11/1998 Manning
6,130,563 A  10/2000 Pilling
(Continued)

OTHER PUBLICATIONS

European Patent Office, European Extended Search Report and Opinion, European Patent Application No. 16852241.5, dated Apr. 8, 2019, 10 Pages.
(Continued)

*Primary Examiner* — Janice N Tieu
(74) *Attorney, Agent, or Firm* — Fenwick & West LLP (57) ABSTRACT

A transmitting device includes an output node, at least one driver circuit and transition equalization circuitry. The driver circuit drives an output data signal including a data transition onto the output node. The output of the transition equalization circuitry is coupled to the output node. The transition equalization circuitry begins to drive the output node at the data transition and ends driving of the output node a pre-determined delay after beginning to drive the output node. The transition equalization circuitry drives the output node by injecting current onto the output node if the data transition is a positive transition, and sinking current from the output node if the data transition is a negative transition.

17 Claims, 7 Drawing Sheets

Related U.S. Application Data

(60) Provisional application No. 62/234,534, filed on Sep. 29, 2015.

(56) References Cited

U.S. PATENT DOCUMENTS

| | | | |
|---|---|---|---|
| 6,246,269 B1 | 6/2001 | Schuler et al. | |
| 7,061,283 B1 | 6/2006 | Ghia et al. | |
| 7,269,212 B1 * | 9/2007 | Chau | H04L 25/03878 326/80 |
| 7,323,907 B1 | 1/2008 | Ku et al. | |
| 8,396,105 B2 | 3/2013 | Gerfers et al. | |
| 8,878,568 B1 | 11/2014 | Farzan et al. | |
| 2003/0112042 A1 | 6/2003 | Takahashi | |
| 2003/0235253 A1 | 12/2003 | Dally | |
| 2012/0119792 A1 | 5/2012 | Wang et al. | |
| 2013/0148704 A1 | 6/2013 | Shinmyo et al. | |
| 2014/0210545 A1 | 7/2014 | Leibowitz et al. | |
| 2015/0055431 A1 | 2/2015 | Lin | |
| 2016/0365137 A1 | 12/2016 | Schumann | |

OTHER PUBLICATIONS

PCT International Notification of Transmittal of the International Search Report and the Written Opinion of the International Searching Authority, PCT Application No. PCT/US2016/045426, dated Oct. 21, 2016, 17 pages.

Wong, K.L.J et al., "A Serial-Link Transceiver with Transition Equalization", IEEE International Solid-State Circuits Conference, Digest of Technical Papers, pp. 223-232, Feb. 6-9, 2006, 10 pages.

European Patent Office, EP Communication Pursuant to Article 94(3) EPC, European Patent Application No. 16852241.5, dated Jun. 8, 2020, 5 Pages.

* cited by examiner

TRANSMITTER WITH SELF-TRIGGERED TRANSITION EQUALIZER

CROSS REFERENCE TO RELATED APPLICATIONS

This application is a continuation of U.S. patent application Ser. No. 15/761,938 filed on Mar. 21, 2018 which is a 35 U.S.C. 371 Patent Application of PCT Application No. PCT/US2016/045426 filed on Aug. 3, 2016, which claims priority from U.S. Provisional Patent Application No. 62/234,534, filed on Sep. 29, 2015, each of which are incorporated by reference herein in their entirety.

BACKGROUND

In high speed communication systems, it is important to maximize the size of a data eye of a transmitted signal. The rise time and fall time of a transmitted signal can reduce the size of the data eye. Additionally, the effect of rise time and fall time on the data eye becomes even more pronounced as the data rate increases.

BRIEF DESCRIPTION OF THE DRAWINGS

The disclosed embodiments have advantages and features that will be more readily apparent from the detailed description, the appended claims, and the accompanying figures (or drawings). A brief introduction of the figures is below.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

In one embodiment, a transmitting device includes an output node, at least one driver circuit and transition equalizer circuitry. The driver circuit drives an output data signal including a data transition onto the output node. The output of the transition equalization circuitry is coupled to the output node. The transition equalization circuitry begins to drive the output node at the data transition and ends the driving the output node a pre-determined delay after beginning to drive the output node. The end of driving can be automatically triggered once the pre-determined delay is reached such that the output node is driven during the transition to speed up the transition.

The transition equalization circuitry may drive the output node by injecting current onto the output node if the data transition is a positive transition, and sinking current from the output node if the data transition is a negative transition. In some embodiments, the drive strength varies depending on the magnitude of the data transition, such as when the transmitted data corresponds to PAM-4 signals.

Figure 1:
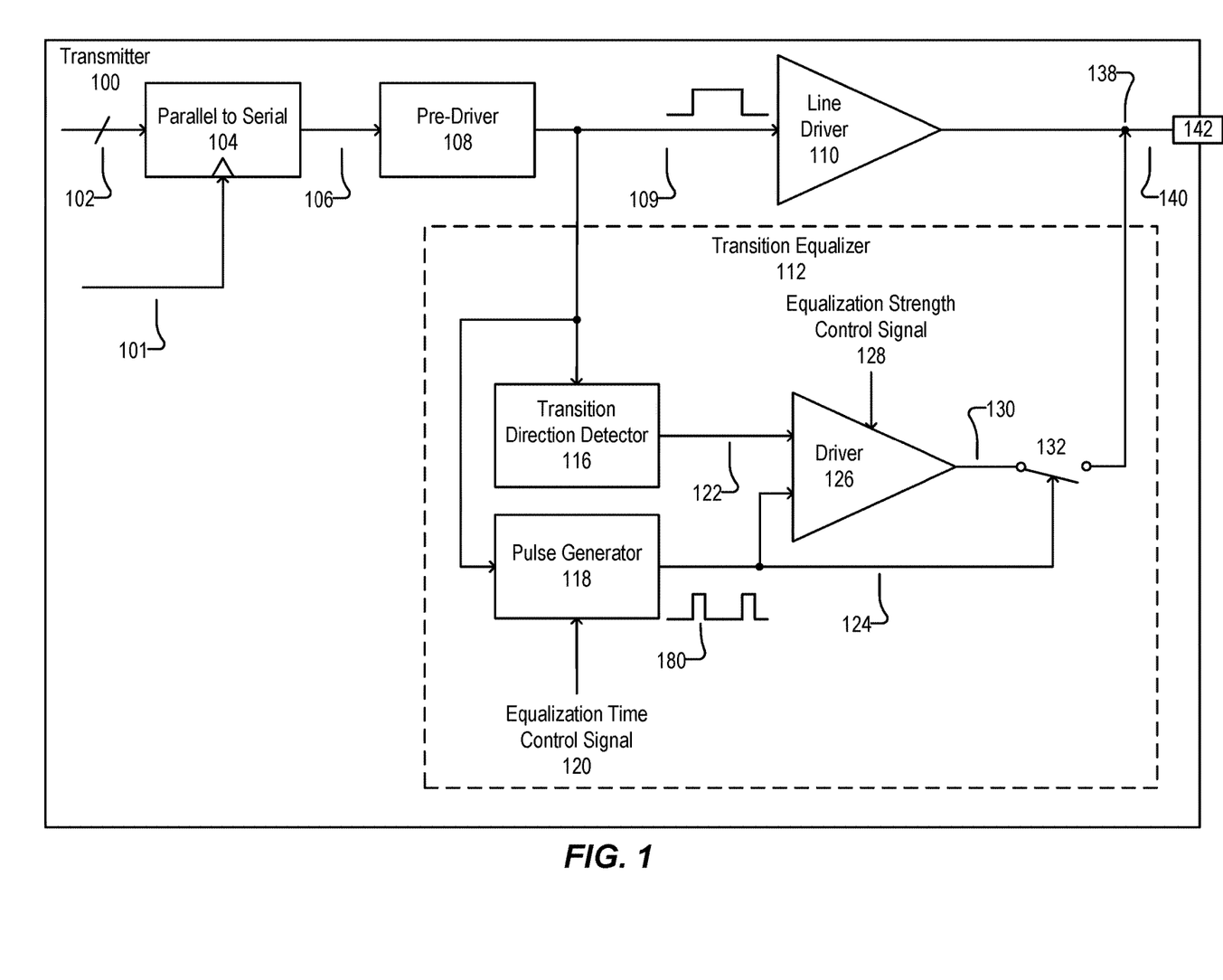
FIG. 1 is a high speed communication system that includes a transmitter, according to a first embodiment.

FIG. 1 is a high speed communication system that includes a transmitter 100, according to a first embodiment. In some embodiments, the transmitter 100 can be a stand-alone device or part of a larger device, such as an application specific integrated circuit (ASIC). The transmitter 100 includes a parallel to serial converter 104, a pre-driver 108, a line driver 110, and a transition equalizer 112. Each of these components can be implemented with hardware circuits that generate signals, and the lines connecting the components carry signals from one component to the next.

The transmitter 100 receives parallel data 102 and converts the parallel data 102 into an equalized output data signal 140 at an output port 142. The output port 142 is connected to a wired communication channel (not shown) that carries the equalized output data signal 140 to a remote receiver.

The parallel data 102 can be M-bits wide. The parallel to serial converter 104 receives the M-bit parallel data 102 and a clock signal 101, converts the M-bit parallel data 102 to serial data 106, and outputs the serial data 106. The parallel to serial converter 104 operates according to the clock signal 101. In one example, the parallel to serial converter 104 is a shift register that receives the M-bit parallel data 102 at a first rate, shifts the parallel data 102, and outputs the shifted parallel data 102 as serial data 106 at a second rate, where the second rate is greater than the first rate. The second rate can be M-times the first rate, where M is the number of bits of the parallel data 102. The second rate can controlled by and vary according to the clock signal 101.

The pre-driver 108 receives the serial data 106 from the parallel to serial converter 104 and outputs one or more driver control signals 109. The driver control signals 109 include signal edges that are aligned with data transitions in the serial data 106, and also trigger the beginning of data transitions in the data signal output from the line driver 110. The data transitions in the serial data 106 can be either positive transitions (e.g., 0 to 1) or negative transitions (e.g., 1 to 0). The line driver 110 receives the driver control signals 109 from the pre-driver 108 and drives a data signal onto an output node 138 based on the driver control signals 109. Specifically, the driver control signal 109 can control the low side and high side drivers (not shown) of the line driver 110. The data signal output from the line driver 110 includes positive and negative data transitions that follow the driver control signals 109. Positive and negative data transitions may also be referred to as rising and falling transitions.

Without the transition equalizer 112, the data signal output from the line driver 110 is slew rate limited and has a slow rise time or a slow fall time during positive and negative data transitions, respectively. The transition equalizer 112 increases the slew rate of the data transitions by injecting current 130 to or sinking current 130 from the output node 138 during the data transitions.

As shown, the transition equalizer 112 receives the driver control signals 109 from the pre-driver 108 and drives the output node 138 in response to data transitions indicated by signal edges of the driver control signals 109. The transition equalizer 112 operates independently from and without use of the clock signal 101. The transition equalizer 112 begins driving the output node 138 at a data transition indicated by a signal edge of the driver control signals 109 and ends driving the output node 138 a pre-determined delay after beginning to drive to the output node 138. In one embodiment, the pre-determined delay is programmable (i.e., adjustable).

The transition equalizer 112 drives the output node 138 by injecting current to or sinking current from the output node 138 depending on edges of the driver control signal 109. The transition equalizer 112 injects current onto the output node 138 if an edge of the driver control signal 109 indicates a positive data transition (e.g. 0 to 1). The transition equalizer 112 sinks current from the output node 138 if an edge of the driver control signals 109 indicates a negative data transition (e.g. 1 to 0). In one embodiment, the drive strength (i.e., amount of current 130 injected/sunk) of the transition equalizer 112 is adjustable.

The transition equalizer 112 includes a transition direction detector 116, a pulse generator 118, a transition equalizing driver 126 and a switch 132. Each of these components can be implemented with hardware circuits that generate signals, and the lines connecting the components carry signals from one component to the next.

The transition direction detector 116 detects data transitions from signal edges of the driver control signals 109 and generates a transition direction signal 122 indicating a direction of the data transition. The transition direction detector 116 detects data transitions by detecting a change in the signal level of the driver control signals 109. The transition direction detector 116 then detects a direction of the transition, such as by comparing the driver control signal 109 to a pre-determined threshold. The transition detector 114 indicates a direction of the data transition through the transition direction signal 122. The transition direction signal 122 indicates whether the detected data transition is a positive transition (e.g., from a low signal level to a high signal level) or a negative transition (e.g., from a high signal level to a low signal level).

The pulse generator 118 detects data transitions from signal edges of the driver control signals 109 and generates a pulse signal 124 having a signal pulse 180. The signal pulse 180 begins at the data transition and the end of the signal pulse 180 is triggered a predetermined delay after the start of the signal pulse. The pulse generator 118 also receives an equalization time control signal 120. The pre-determined delay between the start of a pulse 180 and the end of the pulse 180 is controlled by and varies according to the equalization time control signal 120. The equalization time control signal 120 can be a programmable signal (i.e., adjustable).

The transition equalizing driver 126 receives the transition direction signal 122, the pulse signal 124, and an equalization strength control signal 128, and drives the output node 138 during a data transition by injecting current 130 to or sinking current 130 from the output node 138. The transition equalizing driver 126 injects current 130 to the output node 138 if the transition direction signal 122 indicates a positive data transition and sinks current from the output node 138 if the transition direction signal 122 indicates a negative data transition. The amount of current 130 the transition equalizing driver 126 injects/sinks is controlled by and varies according to the equalization strength control signal 128. The equalization strength control signal 128 can be a programmable signal (i.e., adjustable).

The transition equalizing driver 126 is enabled or disabled by the pulse signal 124. For example, the transition equalizing driver 126 is enabled when the pulse signal 124 is high, and is disabled when the pulse signal 124 is low.

The switch 132 carries current 130 between the transition equalizing driver 126 and the output node 138 according to the pulse signal 124. For example, the switch 132 is closed when the pulse signal 124 is high and opened when the pulse signal 124 is low. The switch 132 and the transition equalizing driver 126 are both controlled by the pulse signal 124. Thus when the pulse signal 124 is high, the switch 132 is enabled and the transition equalizing driver 126 injects/sinks current 130 to/from the output node 138.

The data signal output by the line driver 110 at the output node 138 is driven by the transition equalizer 112 and results in the equalized output data signal 140. In specific, during positive data transitions current 130 is added to the data signal output by the line driver 110 to increase the speed of the positive data transition. During negative data transitions, current 130 is removed from the data signal output by the line driver 110 to increase the speed of the negative data transition. The output port 142 outputs the equalized output data signal 140 across the communication channel.

Figure 2:
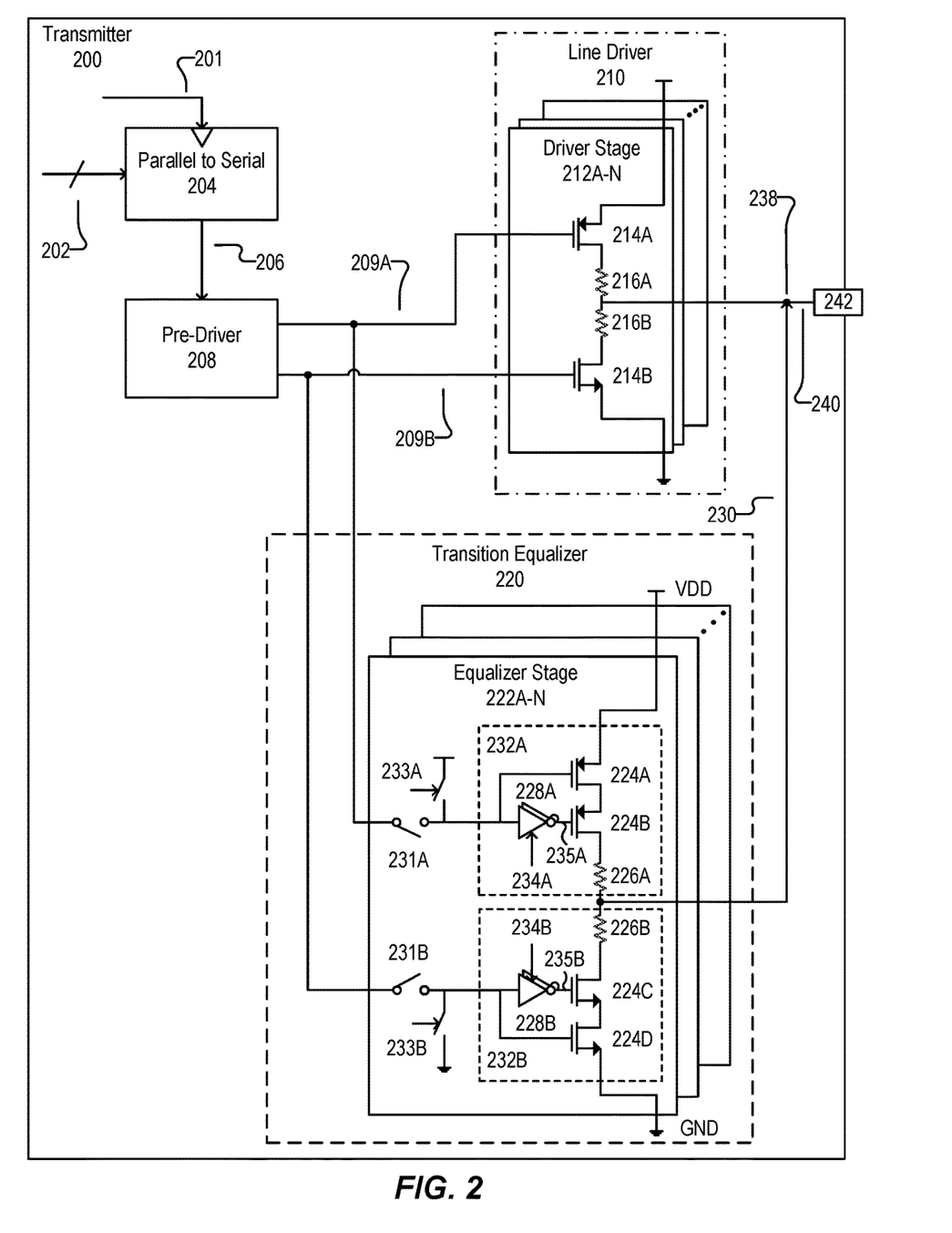
FIG. 2 is a high speed communication system that includes a transmitter, according to a second embodiment.

FIG. 2 is a high speed communication system that includes a transmitter 200, according to a second embodiment. In some embodiments, the transmitter 200 can be a standalone device or part of a larger device, such as an application specific integrated circuit (ASIC). The transmitter 200 includes a parallel to serial converter 204, a pre-driver 208, a line driver 210, and a transition equalizer 220. Each of these components can be implemented with hardware circuits that generate signals, and the lines connecting the components carry signals from one component to the next.

The parallel to serial converter 204 is similar to the parallel to serial converter 104 of FIG. 1. The parallel to serial converter 204 receives M-bit wide parallel data 202, converts the M-bit parallel data 202 to serial data 206 and outputs the serial data 206. The parallel to serial converter 204 operates according to a clock signal 201. In some configurations, the serial data 206 can include NRZ or PAM-2 data. The PAM-2 data can be represented using one bit (e.g., 0 or 1).

The pre-driver 208 receives serial data 206 from the parallel to serial converter 204 and outputs differential driver control signals 209A-B. The differential driver control signals 209A-B include signal edges that are aligned with data transitions in the serial data 206, and also trigger the beginning of data transitions in the data signal output from the line driver 210. In some configurations, the differential pre-driver signals 209A-B can include signal edges that are aligned with data transitions between successive PAM-2 data symbols. One of the differential driver control signals 209 is a positive driver control signal (e.g., 209A) and the other is a negative driver control signal (e.g., 209B).

The line driver 210 receives the differential driver control signals 209A-B and drives a data signal onto the output node 238. The line driver 210 can include multiple driver stages 212A-N in parallel, and each of the driver stages 212A-N can be selectively enabled to adjust a drive strength of the line driver 210. Each of the drivers 212A-N can be enabled or disabled independent of every other driver 212A-N.

Each driver stage 212A-N includes a high side driver comprised of a transistor switch 214A and a resistive component 216A. The positive driver control signal 209A is provided to the gate of the transistor switch 214A and controls whether the transistor switch 214A is open or closed. Each driver stage 212A-N includes a low side driver comprised of a transistor switch 214B and a resistive component 216B. The negative driver control signal 209B is provided to the gate of the transistor switch 214B and controls whether the transistor switch 214B is open or closed. Because the driver control signals 209A and 209B drive the gates of the transistor switches 214A and 214B, they may also be referred to as gate driving signals. In some configurations, the first and second resistive components 216A-B can be resistors.

The transition equalizer 220 also receives the differential driver control signals 209A-B and drives the output node 238 during data transitions of the data signal output by the line driver 210, as indicated by edges of the differential driver control signals 209A-B. The transition equalizer 220 begins to drive the output node 238 at the beginning of a data transition and ends driving the output node 238 a predetermined delay after beginning to drive the output node 238. The transition equalizer 220 operates independently from and without use of the clock signal 201. In some configurations, the transition equalizer 220 drives the output node 238 by injecting or sinking current.

The transition equalizer 220 includes multiple equalizer stages 222A-N in parallel to each other. Each equalizer stage 222A-N includes first through fourth switching transistors 224A-D, first and second resistive components 226A-B, first and second sets of inverters 228A-B, first and second enable switches 233A-B, and first and second enable switches 231A-B.

The first and second switching transistors 224A-B, the first set of inverters 228A and the resistive component 226A form a current injection circuit 232A. The current injection circuit 232A injects current onto the output node 238 responsive to the positive driver control signal 209A indicating a data transition is a positive data transition. The current injection circuit 232A injects current onto the output node 238 through the first resistive component 226A.

The first set of inverters 228A inverts the positive driver control signal 209A into an inverted positive driver control signal 235A. The first switching transistor 224A is controlled by the positive driver control signal 209A and the second switching transistor 224B is controlled by the inverted positive driver control signal 235A. The first and second switching transistors 224A-B and resistive element 226A are coupled in series between a first supply voltage (e.g., VDD) and the output node 238.

The third and fourth switching transistors 224C-D, the second set of inverters 228B and the resistive element 226B can be grouped into a current sinking circuit 232B. The current sinking circuit 232B sinks current from the output node 238 responsive to the negative driver control signal 209B indicating that the data transition is a negative data transition. The current sinking circuit 232B sinks current from the output node 238 through the second resistive component 226B.

The second set of inverters 228B inverts the negative driver control signal 209B into an inverted negative driver control signal 235B. The fourth switching transistor 224D is controlled by an input of the negative driver control signal 209B and the third switching transistor 224C is controlled by the inverted negative driver control signal 235B. The third and fourth switching transistors 224C-D and the second resistive component 226B are coupled in series between the output node 238 and a second supply voltage (e.g., GND).

The transition equalizer 220 can vary the total drive strength (i.e., the amount of current 230 injected/sunk per unit of time) by selectively enabling or disabling the equalizer stages 222A-N. The enable switches 231A-B and the enable switches 233A-B enable each equalizer stage 222A-N when closed, and disable each equalizer stage 222A-N when open. For example, the transition equalizer 220 can enable a first equalizer stage 222A by closing the enable switches 231A-B and the enable switches 233A-B of the first equalizer stage 222A and can disable all the other equalizer stages 222B-N by opening the enable switches 231A-B and the enable switches 233A-B of each of the equalizer stages 222B-N, respectively. In this example, the differential driver control signals 209A-B are input to current injection circuit 232A and the current sink circuit 232B of the first equalizer stage 222A, and the current 230 output from the transition equalizer 220 correspond directly to the current output from the first equalizer stage 222A. Each of the equalizer stages 222A-N can be enabled or disabled independent of any other equalizer stages 222A-N.

In some configurations, the first and second resistive components 226A-B of each of the equalizer stages 222A-N are the same value. The drive strength (i.e., amount of current 230 injected/sunk) of each of the equalizer stages 222A-N is inversely related to the value of the first and second resistive components 226A-B of each of the equalizer stages 222A-N. For example, decreasing the value of the first and second resistive components 226A-B of an equalizer stage 222A-N increases the drive strength of that equalizer stage 222A-N. The transition equalizer 220 varies the total drive strength by selectively enabling or disabling one or more of the equalizer stages 222A-N.

Each of the first and second sets of inverters 228A-B can include multiple inverters in parallel. Each of the inverters of the first and second sets of inverters 228A-B can be enabled/disabled according to first and second equalization time control signals 234A-B, respectively. Enabling a different number of inverters of either the first or second sets of inverters 228A-B varies the delay between the respective input and output of each set of inverters 228A-B. Varying the delay through the first and second sets of inverters 228A-B varies the pre-determined delay between when the transition equalizer 220 begins and ends driving the output node 238. The pre-determined delay between when the current injection circuit 232A begins and ends injecting current is directly related to the number of inverters of the first set of inverters 228A enabled by the equalization time control signal 234A. Similarly, the pre-determined delay between when the current sink circuit 232B begins and ends sinking current is directly related to the number of inverters of the second set of inverters 228B enabled by the equalization time control signal 234B.

The data signal output by the line driver 210 is driven at the output node 238 according to the current 230 and results in the equalized output signal 240. In specific, during positive data transitions current 230 is added to the data signal output by the line driver 210 to increase the speed of the positive data transition. During negative data transitions, current 230 is removed from the data signal output by the line driver 210 to increase the speed of the negative data transition. The output port 242 outputs the equalized output signal 240 across a communication channel.

Figure 3:
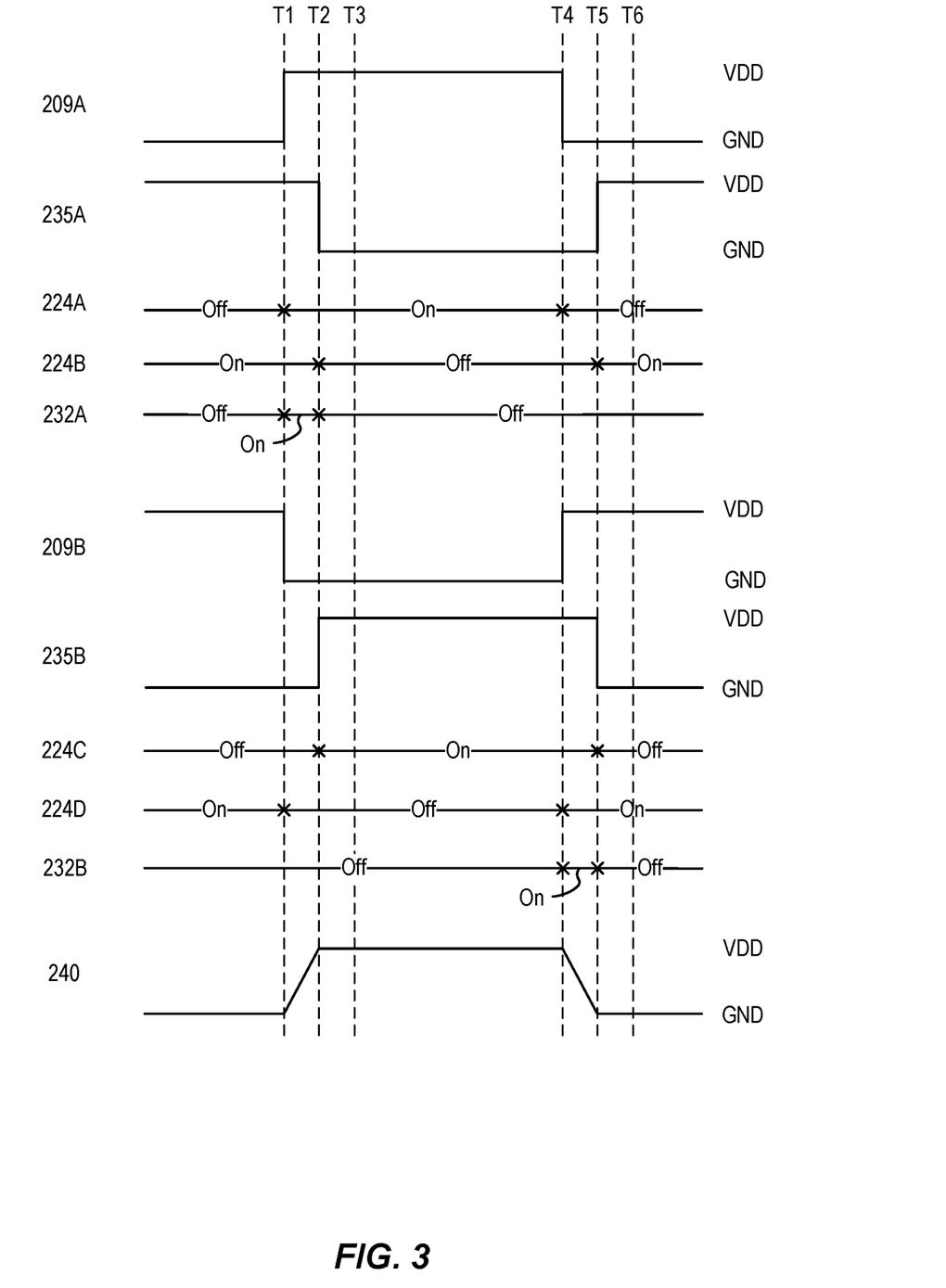
FIG. 3 is a timing diagram for the transmitter of FIG. 2, according to one embodiment.

FIG. 3 illustrates a timing diagram for one of the equalizer stages 222A-N of the transition equalizer 220 of FIG. 2, according to one embodiment. The timing diagram includes waveforms for the following signals: positive driver control signal 209A, inverted positive driver control signal 235A, negative driver control signal 209B, inverted negative driver control signal 235B, and equalized output signal 240. The timing diagram further includes state transitions for first through fourth switching transistors 224A-D, the current injection circuit 232A and the current sinking circuit 232B.

The positive driver control signal 209A transitions from GND to VDD at time T1 and transitions from VDD to GND at time T4. Similarly, the negative driver control signal 209B transitions from VDD to GND at T1 and transitions from GND to VDD at T4.

The transition equalizer 220 increases the slew rate of the data transitions of the data signal output by the line driver 210 by injecting current 230 to or sinking current 230 from the output node 138. That is, the transition equalizer 220 injects current 230 to the output node 238 between T1 and time T2 and the sinks current 230 from the output node 238 between T4 and time T5.

In one example, the transition equalizer 220 can enable a first equalization stage 222A by closing the enable switches 231A-B and the enable switches 233A-B of the first equalizer stage 222A and can disable all the other equalizer stages 222B-N by opening the enable switches 231A-B and the enable switches 233A-B of each of the equalizer stages 222B-N. In this example, the positive driver control signal 209A is input to the current injection circuit 232A of the first equalizer stage 222A. The first switching transistor 224A directly follows the positive driver control signal 209A and the second switching transistor 224B inversely follows the positive driver control signal 209A. The second switching transistor 224B lags the positive driver control signal 209A because of the delay of first set of inverters 228A.

The positive driver control signal 209A transitions from GND to VDD at T1; however, the inverted positive driver control signal 235A transitions from VDD to GND at T2. The delay between T1 and T2 is directly related to the delay of the inverters of the first set of inverters 228A. When the positive driver control signal 209A transitions from GND to VDD at T1, the first switching transistor 224A transitions from an OFF state to an ON state also at T1. However, when the positive driver control signal 209A transitions from GND to VDD at T1, the second switching transistor 224B transitions from an ON state to an OFF state at T2. As noted, the delay between T1 and T2 (i.e., the lag between the first switching transistor 224A and the second switching transistor 224B) is directly related to the delay of the inverters of the first set of inverters 228A. During a period between T1 and T2, both the first and second switching transistors 224A-B are in the ON state and thus the current injection circuit 232A is also in ON state. When in the ON state, the current injection circuit 232A injects current 230 to the output node 238.

The positive driver control signal 209A transitions from VDD to GND at T4; however, the inverted positive driver control signal 235A transitions from GND to VDD at T5. Similar to the delay between T1 and T2, the delay between T4 and T5 is directly related to the delay of the inverters of the first set of inverters 228A. When the positive driver control signal 209A transitions from VDD to GND at T4, the first switching transistor 224A transitions from the ON state to the OFF state also at T4. However, when the positive driver control signal 209A transitions from VDD to GND at T4, the second switching transistor 224B transitions from the OFF state to the ON state at T5. Similar to the delay between T1 and T2, the delay between T4 and T5 (i.e., the lag between the first switching transistor 224A and the second switching transistor 224B) is directly related to the delay of the inverters of the first set of inverters 228A. The current injection circuit 232A only injects current 230 to the output node 238 during the period between T1 and T2 when both the first and second switching transistors 224A-B are in the ON state.

Continuing the example, the negative driver control signal 209B is input to the current sink circuit 232B of the first equalizer stage 222A. The fourth switching transistor 224D directly follows the negative driver control signal 209B and the third switching transistor 224C inversely follows the negative driver control signal 209B. The third switching transistor 224C lags the negative driver control signal 209B because of the second set of inverters 228B.

The negative driver control signal 209B transitions from VDD to GND at T1; however, the inverted negative driver control signal 235B transitions from GND to VDD at T2. Again, the delay between T1 and T2 is directly related to the delay of the inverters of the second set of inverts 228B. When the negative driver control signal 209B transitions from VDD to GND at T1, the fourth switching transistor 224D transitions from an ON state to an OFF state also at T1. When the negative driver control signal 209B transitions from VDD to GND at T1, the third switching transistor 224C transitions from an OFF state to an ON state at T2. As noted, the delay between T1 and T2 is directly related to the delay of the inverters of the second set of inverters 228B.

The negative driver control signal 209B transitions from GND to VDD at T4; however, the inverted negative driver control signal 235B transitions from VDD to GND at T5. Again, the delay between T4 and T5 is directly related to the inverters of the second set of inverters 228B. When the negative driver control signal 209B transitions from GND to VDD at T4, the fourth switching transistor 224D transitions from the OFF state to the ON state also at T4. However, when the negative driver control signal 209B transitions from GND to VDD at T4, the third switching transistor 224C transitions from the ON state to the OFF state at T5. Similar to the delay between T1 and T2, the delay between T4 and T5 is directly related to the delay of the inverters of the second set of inverters 228B. During a period between T4 and T5, both the third and fourth switching transistors 224C-D are in the ON state and thus the current sink circuit 232B is in the ON state. The current sinking circuit 232B only sinks current 230 from the output node 238 during a period between T4 and T5 when both the third and fourth switching transistors 224C-D are in the ON state.

Driving the output node 230 by injecting current 230 during a positive data transition between T1 and T2 and sinking current 230 during a negative data transition between T4 and T5 results in the equalized output signal 240. The equalized output signal 240 has a faster rise time and fall time than a data signal output by a line driver of a transmitter without a transition equalizer. The equalized output signal 240 begins transitioning from GND to VDD at T1 and reaches VDD at T2. The equalized output signal 240 begins transitioning from VDD to GND at T4 and reaches GND at T5.

Figure 4:
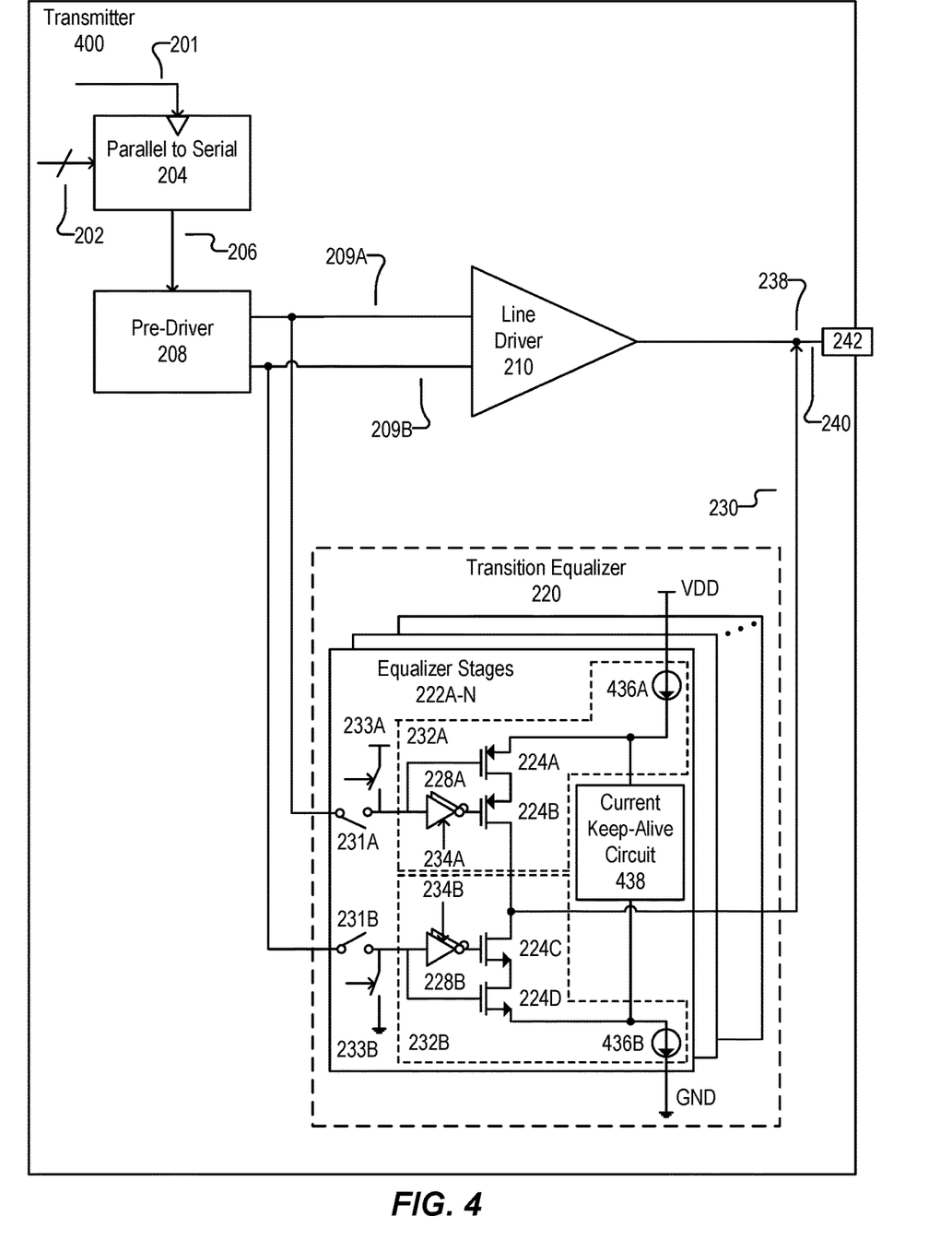
FIG. 4 is a high speed communication system that includes a transmitter, according to a third embodiment.

FIG. 4 is a high speed communication system that includes a transmitter 300, according to a third embodiment. In some embodiments, the transmitter 400 can be a stand-alone device or part of a larger device, such as an application specific integrated circuit (ASIC). The transmitter 400 includes a parallel to serial converter 204, a pre-driver 208, a line driver 210, and a transition equalizer 220. The components of FIG. 4 are similar to those of FIG. 2, except the resistive components 226A-B are replaced with current sources 436A-B and the additionally includes a current keep-alive circuit 438. Each of these components can be implemented with hardware circuits that generate signals, and the lines connected the components carry signals from one component to the next.

The current injection circuit 232A includes a current source 436A to source current to the output node 238 during a positive data transition. The current sinking circuit 232B includes a current sink 436B to sink current from the output node 238 during a negative data transition.

The current keep-alive circuit 438 shunts the current source 436A and the current sink 436B. The current keep-alive circuit 438 provides a current path for the current source 436A and the current sink 436B when they are not sourcing or sinking current from the output node 438.

Figure 5:
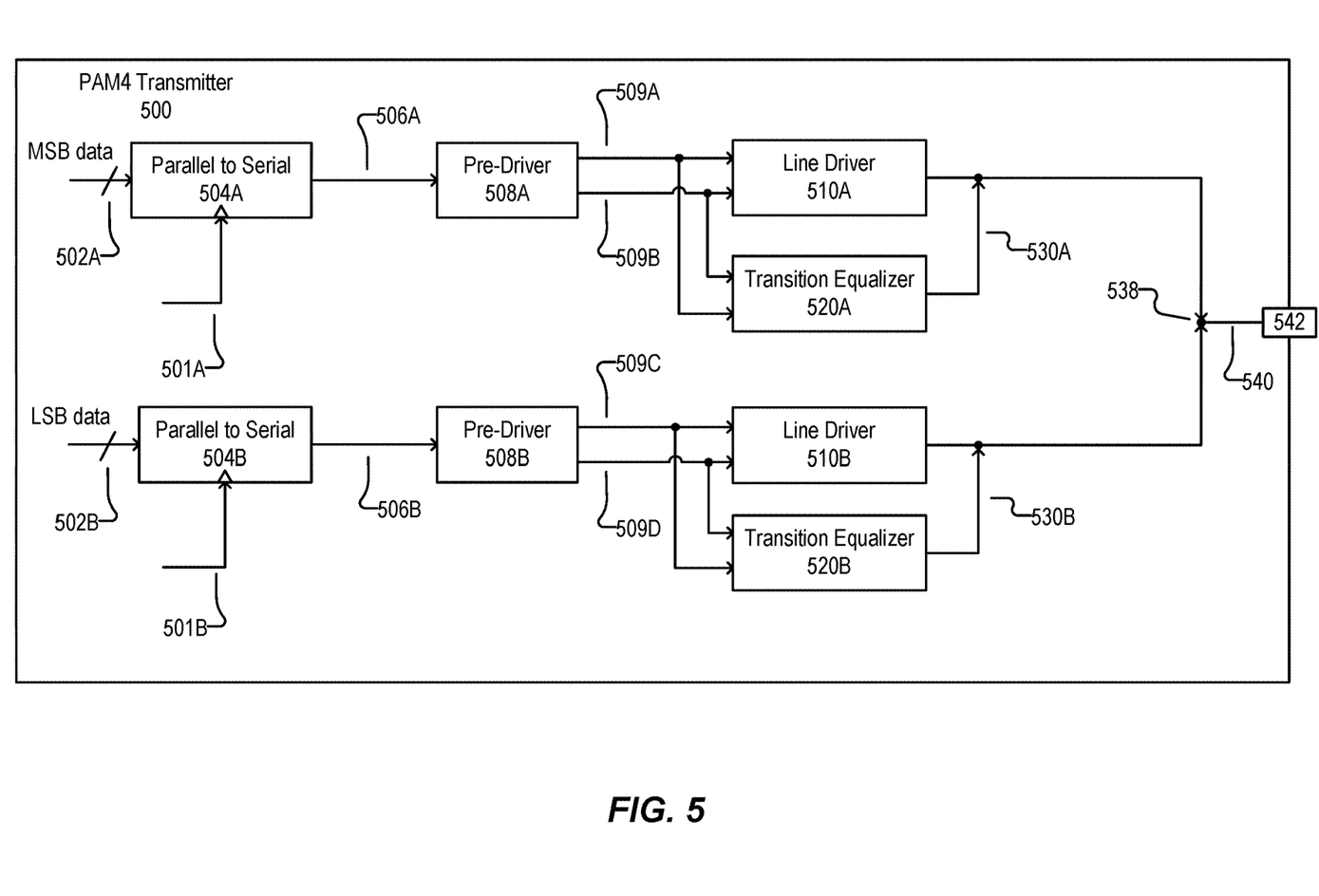
FIG. 5 is a high speed communication system that includes a transmitter, according to a fourth embodiment.

FIG. 5 is a high speed communication system that includes a PAM4 transmitter 500, according to a fourth embodiment. In some embodiments, the transmitter 500 can be a standalone device or part of a larger device, such as an application specific integrated circuit (ASIC). The transmitter 500 includes parallel to serial converters 504A-B, pre-drivers 508A-B, line drivers 510A-B, and transition equalizers 520A-B. The parallel to serial converters 504A-B, the pre-drivers 508A-B, the line drivers 510A-B, and the transition equalizers 520A-B are similar to the parallel to serial converter, the pre-driver, the line driver and the transition equalizer of any other figures.

The parallel to serial converters 504A-B receive M-bit wide parallel data 502A-B, convert the M-bit parallel data 502A-B to serial data 506A-B, and output the serial data 506A-B. The parallel to serial converters 504A-B operate according to clock signals 501A-B, respectively. The parallel data 502A-B can include PAM-4 data. The PAM-4 data can be represented using two-bit symbols including a most-significant-bit (e.g., 502A) and a least-significant-bit (e.g., 502B). For example, a symbol of PAM-4 data can be represented as 00, 01, 11, or 10. Specifically, the parallel to serial converter 504A receives parallel data 502A representing the most significant bit of the PAM-4 data and the parallel to serial converter 504B receives parallel data 502B representing the least significant bit of the PAM-4 data. In this manner, the PAM-4 data is represented as two PAM-2 data bits. It follows that the serial data 506A includes serial data for the most significant bit and the serial data 506B includes serial data for the least significant bit. The upper drive path including pre-driver 508A, line driver 510A, and transition equalizer 520A represent the drive path for the most significant PAM-4 bit. The lower drive path including pre-driver 508B, line driver 510B and transition equalizer 520B represent the drive path for the least significant PAM-4 bit.

The pre-driver 508A receives the serial data 506A for the most significant bit and outputs differential driver control signals 509A-B. The line driver 510A receives the differential driver control signals 509A-B and drives an output signal onto the output node 538. In one embodiment, the line driver 510A can include multiple driver stages similar to the line driver 210 of FIG. 2.

The transition equalizer 520A receives the differential driver control signals 509A-B and outputs current 530A to the output node 538. In one embodiment, the transition equalizer 520A can include multiple equalizer stages similar to the transition equalizer 220 of FIG. 2 or transition equalizer 420 of FIG. 4. The transition equalizer 520A operates independently from and without use of the clock signal 501A.

The pre-driver 508B, the line driver MOB, and the transition equalizer 520B are similar to the pre-driver 508A, the line driver 510A, and the transition equalizer 520A. That is, the pre-driver 508B receives the serial data 506B for the least significant bit and outputs differential driver control signals 509C-D. The line driver 510B receives the differential driver control signals 509C-D and drives an output signal onto the output node 538. The transition equalizer 520B receives the differential driver control signals 509C-D and outputs current 530B to the output node 538. The transition equalizer 520B operates independently from and without use of the clock signal 501B.

The line driver 510A corresponding to the serial data 506A for the most significant bit can have double the drive strength of the line driver 510B corresponding to the serial data 506B for the least significant bit. In one example, the line driver 510A can include double the driver stages as the line driver 510B. Similarly, the transition equalizer 520A can have twice the current output of the transition equalizer 520B.

The drive strength (current 530A/B injected/sunk) for the transition equalizer 520A/B varies depending on the magnitude of the data transition of the differential driver control signals 509A-D. For example, a transition from PAM-4 data 00 to 01 has less drive strength than a transition from PAM-4 data 00 to 11. In the example of the transition from PAM-4 data 00 to 01, only the least significant bit of the PAM-4 data changes. Thus, the transition equalizer 520B corresponding to the serial data 506B for the least significant bit is active while the transition equalizer 520A is not active. On the other hand, in the example of the transition from PAM-4 data 00 to 11, both the most significant bit and the least significant bit of the PAM-4 data change. In this manner, the drive strength varies depending on the magnitude of the data transition.

The output data signals 536A-B at the output node 538 are driven (i.e., with current 530A-B) and result in an equalized output data signal 540. The output port 542 outputs the equalized output data signal 540 across a communication channel.

Figure 6:
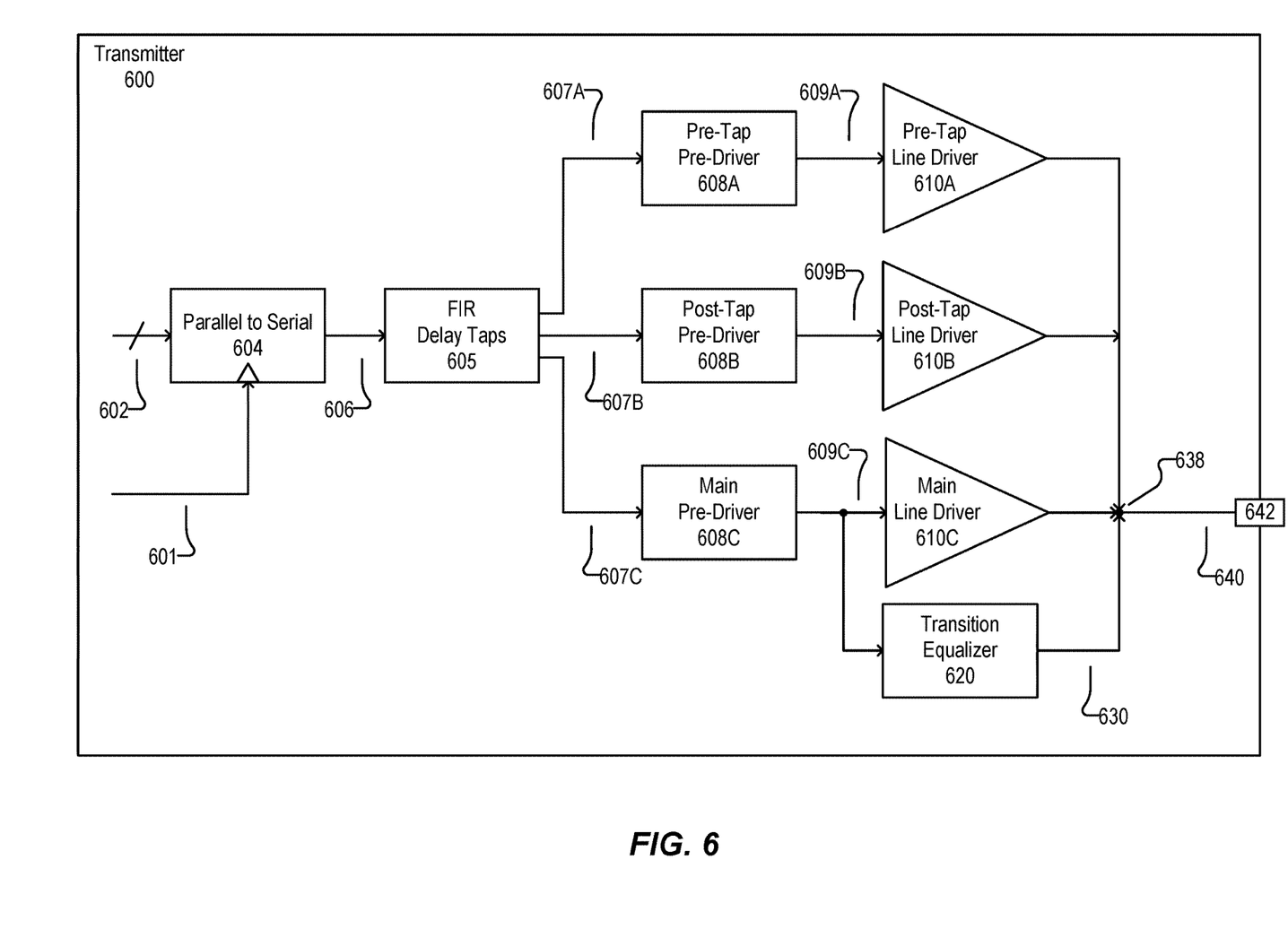
FIG. 6 is a high speed communication system that includes a transmitter, according to a fifth embodiment.

FIG. 6 is a high speed communication system that includes a transmitter 600, according to a fifth embodiment. In some embodiments, the transmitter 600 can be a standalone device or part of a larger device, such as an application specific integrated circuit (ASIC). The transmitter 600 includes a parallel to serial converter 604, a finite impulse response (FIR) delay taps 605, pre-drivers 608A-C, line drivers 610A-C, and a transition equalizer 620. Together the FIR delay taps 605, pre-drivers 608-A-C and line drivers 610A-C form a FIR, which is a filter whose impulse response has finite duration.

The parallel to serial converter 604 receives M-bit wide parallel data 602 and a clock signal 601, converts the M-bit parallel data 502 to serial data 606, and outputs the serial data 606. The parallel to serial converter 604 operates according to the clock signal 601. The FIR filter delay taps 605 receive the serial data 606 and output tap data signals 607 representing different bits of the serial data 606. Main data signal 607C represents a current bit of the serial data 606. Post-tap data signal 607B represents a previous value of the serial data 606. Pre-tap data signal 607A represents a future value of the serial data 606.

The pre-drivers 608A-C receive the signals 607A-C and output driver control signals 609A-C. The pre-tap pre-driver 608A receives the pre-tap data signal 607A and outputs a pre-tap driver control signals 609A. Similarly, the post-tap pre-driver 608B receives the post-tap data signal 607B and outputs a post-tap driver control signals 609B and the main pre-driver 608C receives the main data signal 607C and outputs a main driver control signals 609C.

The line drivers 610A-C receive the driver control signals 609A-C and drive output data signals onto an output node 638. The pre-tap line driver 610A receives the pre-tap driver control signals 609A and drives a pre-tap output data signal onto the output node 638. Similarly, the post-trap line driver 610B receives the post-tap driver control signals 609B and drives a post-tap output data signal onto the output node 638 and the main line driver 610C receives the main driver control signals 609C and drives a main output data signal onto the output node 638.

The transition equalizer 620 receives the main driver control signals 609C from the main pre-driver 608C and drives the output node 638 in response to data transitions indicated by signal edges of the main driver control signals 609C. In other embodiments, the transition equalizer 620 receives the pre-tap driver control signals 609B or the post-tap driver control signals 609C and drives the output node 638 in response to data transitions indicated by signal edges of the pre-tap driver control signals 609B or the post-trap driver control signals 609C, respectively. The transition equalizer 620 operates independently from and without use of the clock signal 601. The transition equalizer 620 drives the output node 638 by injecting charge 630 onto the output node 638 or by sinking current 630 from the output node 638.

The data signals output by the line drivers 610A-C at the output node 638 are driven by the transition equalizer 620 and result in an equalized output data signal 640. The output port 642 outputs the equalized output data signal 640 across a communication channel.

Figure 7:
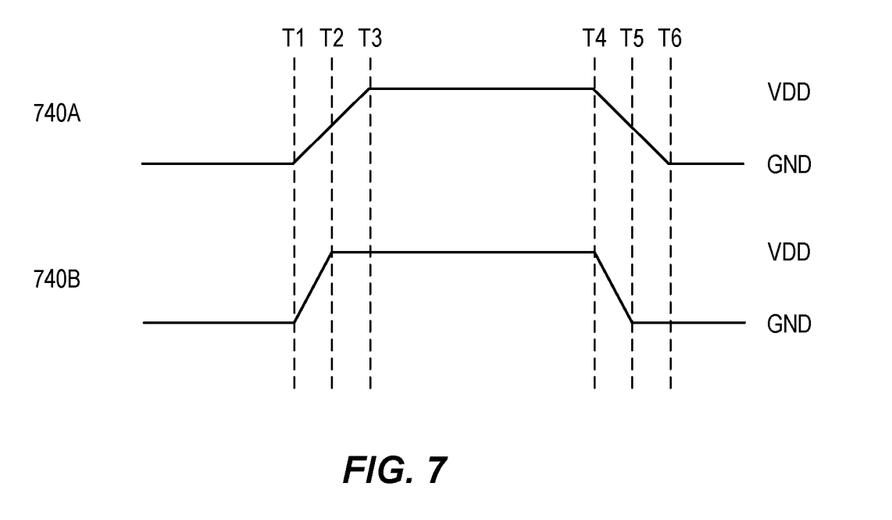
FIG. 7 is a timing diagram of two output signals illustrating the benefits of the present disclosure, according to one embodiment.

FIG. 7 is a timing diagram including an output signal 740A and an equalized output signal 740B, and illustrates the benefits of the present disclosure. The output signal 740A illustrates a data signal output from a line driver when a transition equalizer 220 is not present. The unequalized output signal 740A is slew rate limited and has a slow rise time and a slow fall time. The rise time of the output signal 740A is the amount of time the output signal 740A takes to transition from GND to VDD. That is, the rise time is a difference between time T3 and time T1. Similarly, the fall time is the amount of time the output signal 740A takes to transition from VDD to GND. That is, the fall time is a difference between time T6 and time T4.

The equalized output signal 740B illustrates a data signal output from a line driver (e.g., line driver 210) when a transition equalizer 220 is added, according to embodiments of the present disclosure. The transition equalizer increases the slew rate of data transitions by injecting current to or sinking current from an output node during the data transitions. For example, the transition equalizer injects current to the output node from T1 to time T2 and sinks current form the output node from T4 to time T5. The slew rate of the data transitions illustrated in the equalized output signal 740B is increased when compared to the slew rate of the data transitions of the unequalized output signal 740A. The rise time of the equalized output signal 740B is a difference between T2 and T1 and the fall time is a difference between T5 and T4. Thus, including a transmitter including a transition equalizer amounts to faster rise times and fall times of the equalized output signal when compared to transmitter not including a transition equalizer.

Additional Configuration Considerations

In one embodiment, a representation of circuits within a transmitting device may be stored as data in a non-transitory computer-readable medium (e.g. hard disk drive, flash drive, optical drive). These representations may be in the form of, for example, behavioral level descriptions, register transfer level descriptions, logic component level descriptions, transistor level descriptions or layout geometry-level descriptions.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a transmitter having a self-triggered transition equalizer through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A transmitting device, comprising:
   an output node;
   at least one driver circuit to drive an output data signal onto the output node, the output data signal having a plurality of data transitions; and
   transition equalization circuitry having an output coupled to the output node, the transition equalization circuitry driving the output node with a drive strength that varies depending on a magnitude of change of digital data in the plurality of data transitions,
   wherein the transition equalization circuitry drives the output node by injecting current onto the output node responsive to a first data transition in the plurality of data transitions being a positive transition, and sinking current from the output node responsive to a second data transition in the plurality of data transitions being a negative transition.

2. The transmitting device of claim 1, wherein the drive strength of the transition equalizer circuitry varies by adjusting an amount of the current injected into or sunk from the output node based on the magnitude of change of the digital data.

3. The transmitting device of claim 1, wherein the drive strength of the transition equalization circuitry is adjustable.

4. The transmitting device of claim 3, wherein transition equalization circuitry includes a plurality of circuit stages coupled in parallel to each other, the circuit stages being selectively enabled to adjust the drive strength.

5. The transmitting device of claim 1, wherein the driver circuit is a main driver of a finite impulse response driver.

6. The transmitting device of claim 1, further comprising:
   a pre-driver circuit to generate at least one driver control signal,
   wherein the driver circuit drives the output data signal at the output node based on the driver control signal, and
   wherein the transition equalization circuitry triggers the driving of the output node responsive to the driver control signal.

7. The transmitting device of claim 6, wherein the transition equalization circuitry comprises:
   a transition direction circuit to generate a data transition direction signal indicating whether the data transition is a positive transition or a negative transition based on the least one driver control signal;
   a pulse generator circuit to generate a pulse signal having a signal pulse, a start of the signal pulse triggered by the least one driver control signal and an end of the signal pulse being a pre-determined delay after the start of the signal pulse; and
   a transition adjuster circuit to inject current to or sink current from the output node based on the transition direction signal, the transition adjuster circuit being enabled or disabled by the pulse signal.

8. The transmitting device of claim 6, wherein the at least one driver control signal comprises a positive driver control signal and a negative driver control signal, and the transition equalization circuitry comprises:
   a current injection circuit to inject current onto the output node responsive to the positive driver control signal indicating that the data transition is a positive data transition; and
   a current sinking circuit to sink current from the output node responsive to the negative driver control signal indicating that the data transition is a negative data transition.

9. The transmitting device of claim 8, wherein the current injection circuit comprises a first resistor through which current is injected to the output node, and the current sinking circuit comprises a second resistor through which current is sunk from the output node.

10. The transmitting device of claim 8, wherein the current injection circuit comprises a first current source to source current to the output node, and the current sinking circuit comprises a current sink to sink current from the output node.

11. The transmitting device of claim 8, wherein the current injection circuit comprises:
    a first inverter to invert the positive pre-driver signal into an inverted positive pre-driver signal;
    a first switch controlled by an input of the first inverter; and
    a second switch controlled by an output of the first inverter, the first switch and the second switch coupled in series between a first supply voltage and the output node; and
    wherein the current sinking circuit comprises:
    a second inverter to invert the negative pre-driver signal into an inverted negative pre-driver signal;
    a third switch controlled by an input of the second inverter; and
    a fourth switch controlled by an output of the second inverter, the third switch and the fourth switch coupled in series between a second supply voltage and the output node.

12. The transmitting device of claim 6, wherein the at least one driver circuit comprises a first driver to drive the output signal onto the output node based on the at least one first driver control signal corresponding to a least significant bit of a multi-bit data symbol and a second driver to drive the output signal onto the output node based on at least one second driver control signal corresponding to a most significant bit of a multi-bit data symbol; and
    wherein the transition equalization circuitry triggers the driving of the output node responsive to the at least one first driver control signal and the at least one second driver control signal.

13. A method of operation in a transmitting device, comprising:
    driving, with a line driver, an output data signal onto an output node, the output data signal having a plurality of data transitions; and
    driving, with a transition equalizer circuit, the output node with a drive strength that varies depending on a magnitude of change of digital data in the plurality of data transitions,
    wherein the drive strength varies by adjusting an amount of current injected into or sunk from the output node based on the magnitude of change of the digital data.

14. The method of claim 13, wherein driving the output node comprises:
    injecting current onto the output node responsive to the data transition being a positive transition; and
    sinking current from the output node responsive to the data transition being a negative transition.

15. The method of claim 13, wherein driving the output data signal with a line driver comprises:
    driving, by the line driver, the output data signal onto the output node based on the at least one first driver control signal corresponding to a least significant bit of a multi-bit data symbol and at least one second driver control signal corresponding to a most significant bit of a multi-bit data symbol; and wherein driving the output node with the drive signal is triggered responsive to the at least one first driver control signal and the at least one second driver control signal.

16. A non-transitory computer readable storage medium storing a representation of a transmitting device, the transmitting device comprising:
- at least one driver circuit to drive an output data signal onto an output node, the output data signal having a plurality of data transitions; and
- transition equalization circuitry having an output coupled to the output node, the transition equalization circuitry driving the output node with a drive strength that varies depending on a magnitude of change of digital data in the plurality of data transitions,
- wherein the transition equalization circuitry drives the output node by injecting current onto the output node responsive to a first data transition in the plurality of data transitions being a positive transition, and sinking current from the output node responsive to a second data transition in the plurality of data transitions being a negative transition.

17. The non-transitory computer readable storage medium of claim 16, wherein the drive strength of the transition equalizer circuitry varies by adjusting an amount of the current injected into or sunk from the output node based on the magnitude of change of the digital data.

* * * * *